(12) United States Patent
Delacruz et al.

(10) Patent No.: US 9,768,216 B2
(45) Date of Patent: Sep. 19, 2017

(54) IMAGE SENSOR DEVICE WITH DIFFERENT WIDTH CELL LAYERS AND RELATED METHODS

(71) Applicant: STMICROELECTRONICS PTE LTD, Singapore (SG)

(72) Inventors: Dave Alexis Delacruz, Singapore (SG); David Gani, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 287 days.

(21) Appl. No.: 14/535,423

(22) Filed: Nov. 7, 2014

(65) Prior Publication Data

US 2016/0133662 A1 May 12, 2016

(51) Int. Cl.
*H01L 27/146* (2006.01)
*G03B 17/02* (2006.01)
*G03B 29/00* (2006.01)
*G03B 3/10* (2006.01)

(52) U.S. Cl.
CPC .......... *H01L 27/14625* (2013.01); *G03B 3/10* (2013.01); *G03B 17/02* (2013.01); *G03B 29/00* (2013.01); *H01L 27/14618* (2013.01); *H01L 27/14685* (2013.01)

(58) Field of Classification Search
CPC ............. H01L 27/146; H01L 27/14618; H01L 27/14625; H01L 27/14636; H01L 27/14685; G02F 1/0311; G02F 1/0316; G02F 1/0322; G02F 2001/3503; G03B 3/10; G03B 17/00; G03B 29/00
See application file for complete search history.

(56) References Cited

U.S. PATENT DOCUMENTS

| | | | | |
|---|---|---|---|---|
| 5,150,234 A | * | 9/1992 | Takahashi | G02B 3/14 349/1 |
| 2005/0134776 A1 | * | 6/2005 | Imai | H04N 5/2254 349/123 |
| 2006/0044450 A1 | * | 3/2006 | Wolterink | G02B 13/006 348/340 |
| 2006/0114534 A1 | * | 6/2006 | Batchko | G02B 3/14 359/15 |
| 2006/0215107 A1 | * | 9/2006 | Horiuchi | G02F 1/133382 349/200 |
| 2009/0057544 A1 | | 3/2009 | Brodie et al. | |
| 2009/0213319 A1 | * | 8/2009 | Sasaki | G02F 1/1303 349/189 |

(Continued)

OTHER PUBLICATIONS

LensVector, "Gen 3 Product Brief, LensVector AutoFocus (LVAF) and Driver IC," 2011, pp. 1-4.

*Primary Examiner* — John Lee
(74) *Attorney, Agent, or Firm* — Slater Matsil, LLP (57) ABSTRACT

An image sensor device may include an interconnect layer, an image sensor IC on the interconnect layer, and a barrel adjacent the interconnect layer and having first electrically conductive traces. The image sensor device may include a liquid crystal focus cell carried by the barrel and having cell layers, and second electrically conductive contacts. A pair of adjacent cell layers may have different widths. The image sensor device may include an electrically conductive adhesive body coupling at least one of the second electrically conductive contacts to a corresponding one of the first electrically conductive traces.

23 Claims, 5 Drawing Sheets

(56) References Cited

U.S. PATENT DOCUMENTS

| | | | |
|---|---|---|---|
| 2009/0284827 A1* | 11/2009 | Verstegen | G02B 3/14 359/315 |
| 2010/0053539 A1* | 3/2010 | Lin | G02F 1/13 349/200 |
| 2010/0165134 A1* | 7/2010 | Dowski, Jr. | B24B 13/06 348/218.1 |
| 2011/0221950 A1 | 9/2011 | Oostra et al. | |
| 2011/0261550 A1 | 10/2011 | Wong et al. | |
| 2011/0317065 A1* | 12/2011 | Lin | G03B 17/02 348/373 |
| 2012/0019761 A1* | 1/2012 | Nystrom | G02F 1/1345 349/139 |
| 2012/0026451 A1* | 2/2012 | Nystrom | G02C 7/083 349/200 |
| 2012/0070145 A1* | 3/2012 | Wong | G02B 27/0018 396/439 |
| 2012/0100785 A1* | 4/2012 | Ishimasa | H01L 21/02021 451/41 |
| 2012/0140101 A1* | 6/2012 | Afshari | H04N 5/2257 348/308 |
| 2012/0169988 A1* | 7/2012 | Ko | G02B 7/08 349/200 |
| 2012/0236248 A1* | 9/2012 | Kang | G02B 7/022 349/200 |
| 2013/0164867 A1 | 6/2013 | Ramasamy et al. | |
| 2013/0250197 A1* | 9/2013 | Khodadad | G02F 1/13306 349/33 |
| 2013/0314632 A1* | 11/2013 | Zohrabyan | G02F 1/29 349/36 |
| 2014/0028924 A1* | 1/2014 | Yamaguchi | G02F 1/29 349/1 |
| 2014/0076845 A1* | 3/2014 | Nystrom | G02F 1/1345 216/23 |
| 2014/0131444 A1* | 5/2014 | Wang | G06K 7/10831 235/454 |
| 2015/0103297 A1* | 4/2015 | Lim | G02F 1/29 349/122 |
| 2015/0138420 A1* | 5/2015 | Looi | G03B 3/10 348/335 |
| 2015/0198830 A1* | 7/2015 | Galstian | C08J 3/28 349/36 |
| 2015/0277180 A1* | 10/2015 | Seo | G02F 1/13306 349/58 |
| 2016/0041449 A1* | 2/2016 | Clark | G02F 1/134309 623/6.56 |
| 2016/0133662 A1* | 5/2016 | Delacruz | H01L 27/14625 250/239 |

\* cited by examiner

IMAGE SENSOR DEVICE WITH DIFFERENT WIDTH CELL LAYERS AND RELATED METHODS

TECHNICAL FIELD

The present disclosure relates to the field of electronic devices, and, more particularly, to image sensors and related methods.

BACKGROUND

Typically, electronic devices include one or more camera modules for providing enhanced media functionality. For example, the typical electronic device may utilize the camera modules for photo capturing and video teleconferencing. In the typical electronic device with multiple camera modules, the primary camera module has a high pixel density and an adjustable focus lens system, while the secondary camera module is front-facing and has a lower pixel density. Also, the secondary camera module may have a fixed focus lens system.

For example, U.S. Patent Application No. 2009/0057544 to Brodie et al, assigned to the present application's assignee, discloses a camera module for a mobile device. The camera module comprises a lens, a housing carrying the lens, and a lens cap over the lens and housing. The camera module includes a barrel mechanism for adjusting the lens. During manufacture of an electronic device including one or more camera modules, there is a desire to manufacture the electronic device as quickly as possible, particularly in mass production runs. Also, given the typical mobile device application, there is a desire to reduce the size of the camera module.

One approach to reducing the size of an optical device includes using a liquid crystal cell that operates as a variable focus lens. Rather than physically moving a lens element like traditional mechanical approaches to focusing a lens, in a liquid crystal cell, a small control voltage is applied to dynamically change the refractive index of the material the light passes through. Such a liquid crystal cell is available from LensVector, Inc. of Sunnyvale, Calif.

Connecting the liquid crystal cell within an optical device, for example, within a lens housing, may be performed using an electrically conductive adhesive. More particularly, one or more pairs of opposing electrically conductive contacts may be associated with the liquid crystal cell, and the electrically conductive adhesive is used to electrically couple the electrical contacts.

U.S. Patent Application Publication No. 2011/0221950 to Oostra et al. discloses a camera device. The camera device includes an image sensor integrated circuit (IC), and a lens over the image sensor IC. The camera device also includes an electrically variable focus polymer-stabilized liquid crystal lens over the image sensor IC, and conductive glue around the variable focus polymer-stabilized liquid crystal lens.

Figure 1:
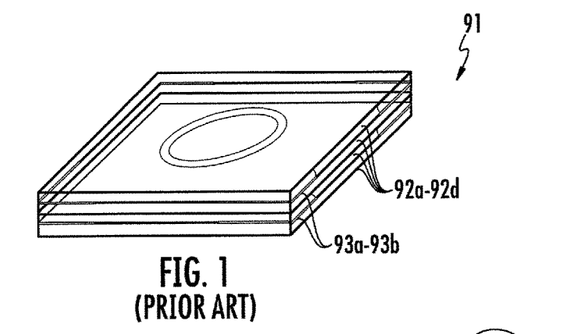
FIG. 1 is a schematic diagram of a perspective view of a liquid crystal focus cell, according to the prior art.
Figure 2A:
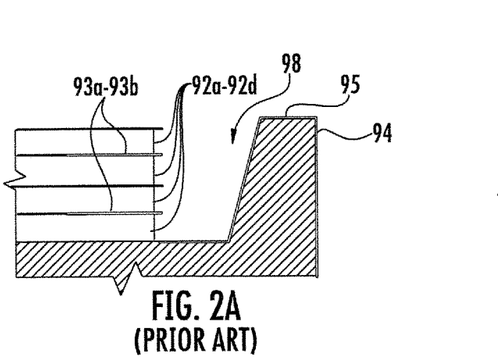
FIGS. 2A and 2B are schematic diagrams of cross-section views during steps of making an image sensor device, according to the prior art.
Figure 2B:
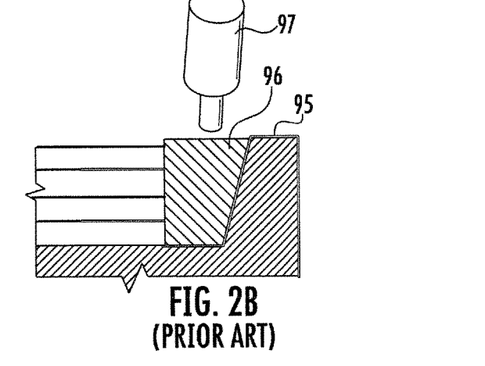
Figure 3:
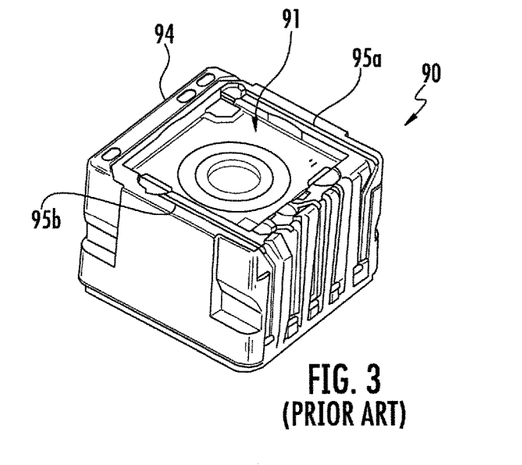
FIG. 3 is a schematic diagram of a perspective view of the image sensor device from FIGS. 2A-2B.

Referring to FIGS. 1-3, an approach to an image sensor device 90 is shown. The image sensor device 90 includes a liquid crystal cell 91 comprising a plurality of cell layers 92a-92d, and a plurality of electrically conductive contacts 93a-93b carried thereby. The image sensor device 90 includes a housing 94, a plurality of electrically conductive traces 95a-95b carried by the housing, and electrically conductive paste 96 coupling the electrically conductive traces and the electrically conductive contacts. The housing 94 and the liquid crystal cell 91 define a recess 98 therebetween, and the electrically conductive paste 96 fills the recess (being dispensed by a nozzle 97 during manufacturing steps shown in FIGS. 2A-2B).

SUMMARY

Generally speaking, an image sensor device may comprise an interconnect layer, an image sensor IC on the interconnect layer and having an image sensing surface, and a barrel adjacent the interconnect layer and comprising a first plurality of electrically conductive traces. The image sensor device may include a liquid crystal focus cell carried by the barrel and comprising a plurality of cell layers, and a second plurality of electrically conductive contacts associated therewith, at least one pair of adjacent cell layers having different widths. The image sensor device may include an electrically conductive adhesive body coupling at least one of the second plurality of electrically conductive contacts to a corresponding one of the first plurality of electrically conductive traces.

In some embodiments, the plurality of cell layers may have a beveled peripheral edge. The beveled peripheral edge may be wider at a bottom adjacent the barrel. In other embodiments, the at least one pair of adjacent cell layers may have a stepped peripheral edge. The stepped peripheral edge may have an exposed portion of a respective second electrically conductive contact.

More specifically, the electrically conductive adhesive body is unbounded on a side thereof opposite of the second plurality of electrically conductive contacts. In some embodiments, the liquid crystal focus cell may comprise a solid state autofocus lens cell, and the second plurality of electrically conductive contacts may be configured to control an autofocus function of the solid state autofocus lens cell. For example, each cell layer of the liquid crystal focus cell may be square-shaped.

Another aspect is directed to a method for making an image sensor device. The method may include positioning an image sensor IC on an interconnect layer, the image sensor IC having an image sensing surface, and positioning a barrel adjacent the interconnect layer and comprising a first plurality of electrically conductive traces. The method may include positioning a liquid crystal focus cell to be carried by the barrel and comprising a plurality of cell layers, and a second plurality of electrically conductive contacts associated therewith, at least one pair of adjacent cell layers having different widths. The method may further include forming an electrically conductive adhesive body for coupling at least one of the second plurality of electrically conductive contacts to a corresponding one of the first plurality of electrically conductive traces.

DETAILED DESCRIPTION

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and prime notation is used to indicate similar elements in alternative embodiments.

Figure 4:
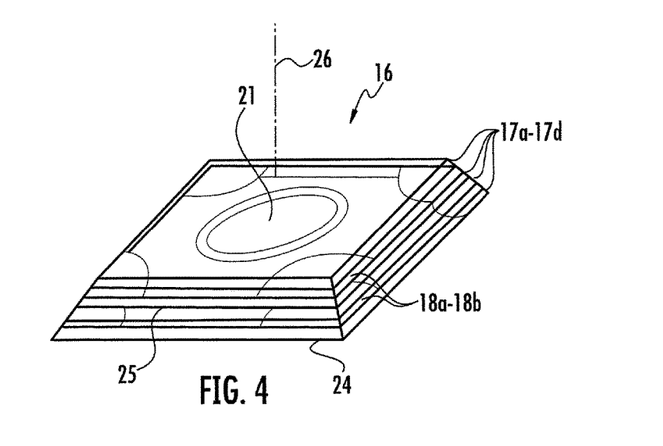
FIG. 4 is a schematic diagram of a perspective view of a liquid crystal focus cell, according to the present disclosure.
Figure 5A:
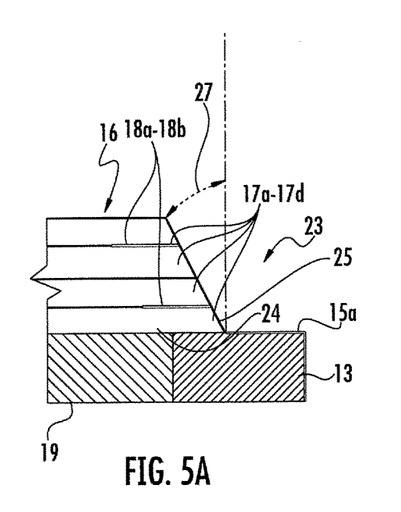
FIGS. 5A and 5B are schematic diagrams of cross-section views during steps of making an image sensor device, according to the present disclosure.
Figure 5B:
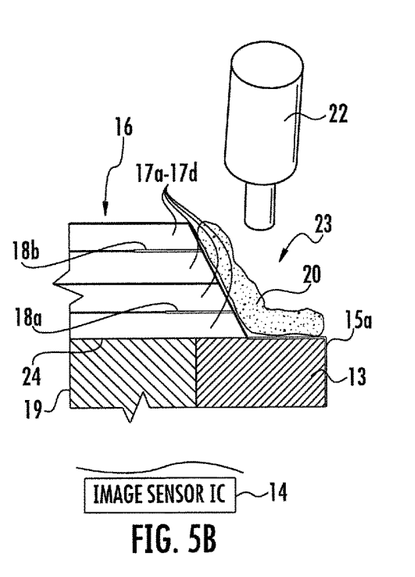
Figure 6:
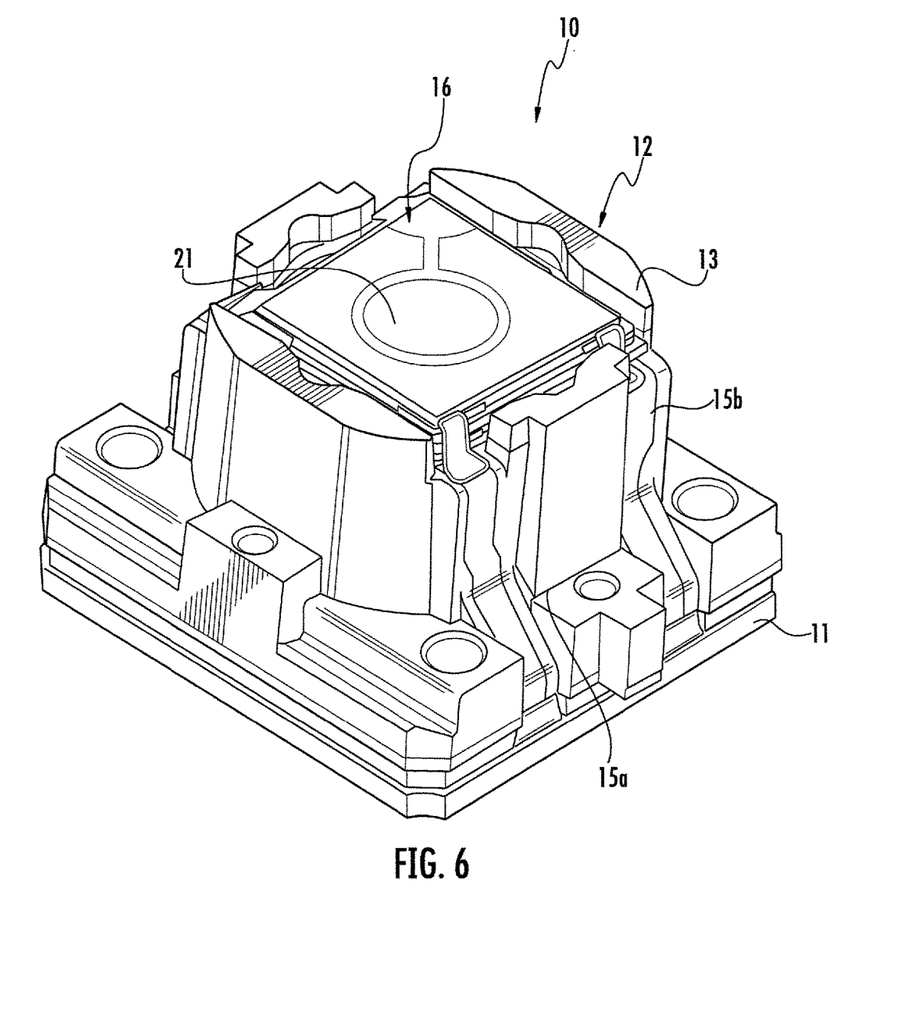
FIG. 6 is a schematic diagram of a perspective view of the image sensor device from FIGS. 5A-5B.

Referring initially to FIGS. 4-6, an image sensor device 10 according to the present disclosure is now described. The image sensor device 10 illustratively includes an interconnect layer 11, an image sensor IC 14 on the interconnect layer and having an image sensing surface, and a barrel 12 adjacent the interconnect layer and comprising a first plurality of electrically conductive traces 15a-15b thereon. The interconnect layer 11 may include a dielectric substrate, and electrically conductive traces thereon for providing input/output for the image sensor device 10.

The image sensor device 10 illustratively includes a liquid crystal focus cell 16 carried by the barrel 12. The liquid crystal focus cell 16 includes a plurality of cell layers 17a-17d, a second plurality of electrically conductive contacts 18a-18b carried by the cell layers, and a configurable lens portion 21 located in a medial portion thereof. The second plurality of electrically conductive contacts 18a-18b is illustratively located at each of the four corners of the liquid crystal focus cell 16. For example, each cell layer 17a-17d of the liquid crystal focus cell 16 is illustratively square-shaped, but other shapes are possible, such as a circle-shape.

The liquid crystal focus cell 16 may comprise the focus cell available from LensVector, Inc. of Sunnyvale, Calif. modified by the teachings disclosed herein. In particular, the liquid crystal focus cell 16 may comprise a solid state autofocus lens cell, and the second plurality of electrically conductive contacts 18a-18b may be configured to control an autofocus function of the solid state autofocus lens cell.

As perhaps best seen in FIG. 4, each of the adjacent cell layers 17a-17d has different widths. In the illustrated embodiment, the plurality of cell layers 17a-17d has a beveled (canted/tapered/slanted) peripheral edge 25. The beveled peripheral edge 25 is wider at a bottom surface 24 adjacent the barrel 12. Also, as depicted, each of the adjacent cell layers 17a-17d has a canted edge. The liquid crystal focus cell 16 illustratively has a trapezoid cross-sectional shape and has a plateaued pyramid three-dimensional shape. This canted, tapered, slanted peripheral edge of glass design (adjacent cell layers 17a-17d) can also be achieved by doing mechanical cutting on the cell using a V groove design dicing blade.

In the illustrated embodiment, the beveled peripheral edge 25 has an angle 27 of 25 degrees with respect to an optical axis 26 (other embodiments may include an angle in the range of 10-40 degrees). As will be appreciated, the optical axis 26 extends perpendicularly from a center of the liquid crystal focus cell 16.

The image sensor device 10 illustratively includes an electrically conductive adhesive body 20 coupling (or at least one) each adjacent pair (or at least one) of the second plurality of electrically conductive contacts 18a-18b to a corresponding one of the first plurality of electrically conductive traces 15a-15b. For example, the electrically conductive adhesive body 20 may comprise electrically conductive jetted adhesive.

More specifically, the liquid crystal focus cell 16 has the bottom surface 24 adjacent a top surface of the barrel 12 to define a free space 23 therebetween. In the illustrated embodiment, the bottom surface 24 of the liquid crystal focus cell 16 and the top surface the barrel 12 are aligned with each other. The electrically conductive adhesive body 20 illustratively extends through the free space 23. In other words, the electrically conductive adhesive body 20 is unbounded on a side thereof opposite of the second plurality of electrically conductive contacts 18a-18b.

The barrel 12 illustratively includes an (outer) housing 13 (mount) carrying the first plurality of electrically conductive traces 15a-15b, and an inner housing 19 (lens barrel) directly under the liquid crystal focus cell 16. The first plurality of electrically conductive traces 15a-15b illustratively extend from the interconnect layer 11 to the second plurality of electrically conductive contacts 18a-18b.

Referring in particular to FIGS. 5A-5B, another aspect is directed to a method for making an image sensor device 10. The method may include positioning an image sensor IC 14 on an interconnect layer 11, the image sensor IC having an image sensing surface, and positioning a barrel 12 adjacent the interconnect layer and comprising a first plurality of electrically conductive traces 15a-15b thereon. The method may include positioning a liquid crystal focus cell 16 to be carried by the barrel 12 and comprising a plurality of cell layers 17a-17d, and a second plurality of electrically conductive contacts 18a-18b associated therewith.

Figure 7:
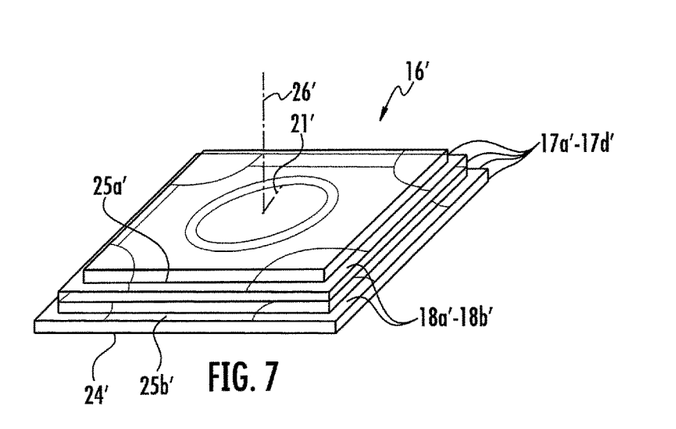
FIG. 7 is a schematic diagram of a perspective view of another embodiment of a liquid crystal focus cell, according to the present disclosure.
Figure 8A:
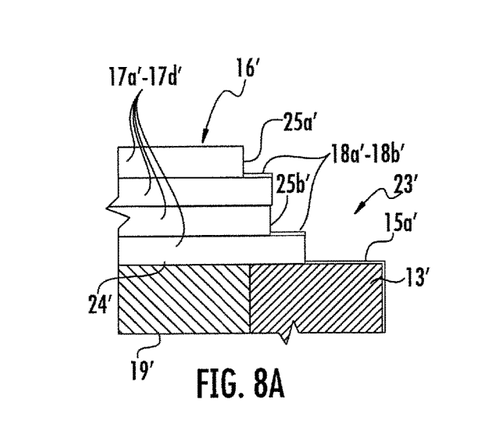
FIGS. 8A and 8B are schematic diagrams of cross-section views during steps of making another embodiment of the image sensor device, according to the present disclosure.
Figure 8B:
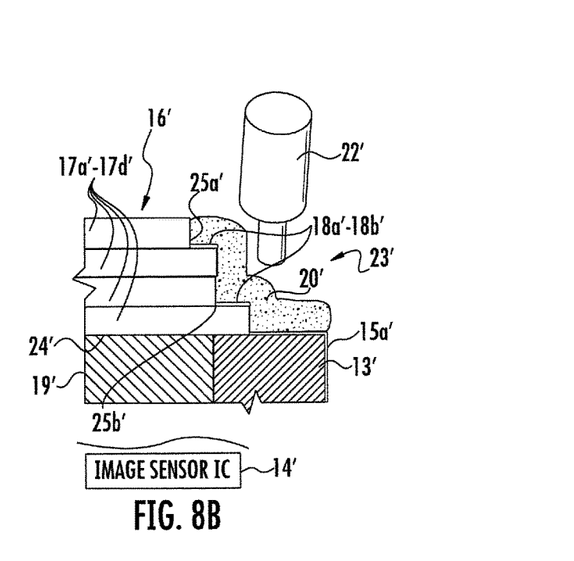
Figure 9:
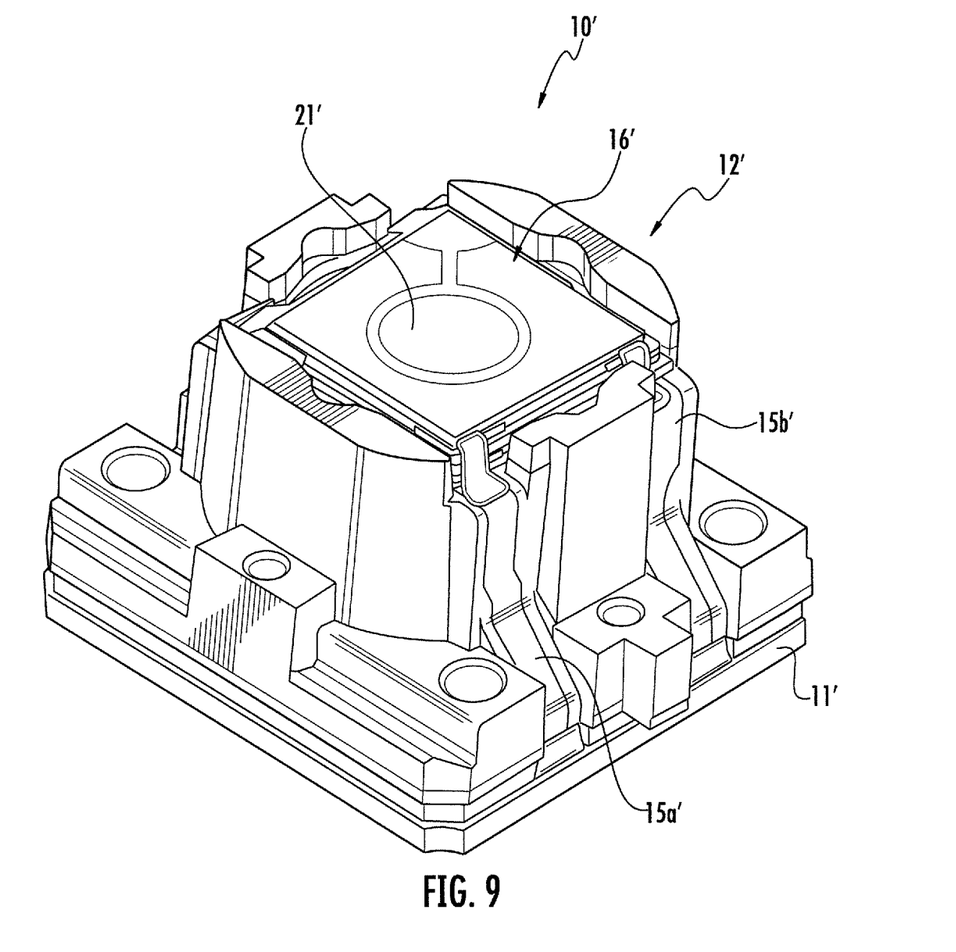
FIG. 9 is a schematic diagram of a perspective view of the image sensor device from FIGS. 8A-8B.

The method includes forming the liquid crystal focus cell 16 to have at least one pair of adjacent cell layers 17a-17d having different widths. In particular, the method may include removing a portion of the plurality of cell layers 17a-17d so that the plurality of cell layers has a beveled peripheral edge 25 or has a stepped peripheral edge 25a'-25b' (FIGS. 7-9). The removing step may comprise a mechanical cutting with a dicing blade at the peripheral edge of the cell layers 17a-17d, the dicing blade being available from Disco Hi-Tec America, Inc. of Santa Clara, Calif. (other dicing blades may also be used). In particular, for the embodiment of FIGS. 4-6, the dicing blade may have a low tip angle to form the beveled peripheral edge 25. For the embodiment of FIGS. 7-9, three dicing blades of progressively increasing width may be used in three steps for grinding the plurality of cell layers 17a-17d. In other embodiments, this removing step may comprise a chemical etching process.

The method may further include forming an electrically conductive adhesive body 20 for coupling at least one of the second plurality of electrically conductive contacts 18a-18b to a corresponding one of the first plurality of electrically conductive traces 15a-15b. In some embodiments, the electrically conductive adhesive body 20 may be jet dispensed from a nozzle 22. Other methods of electrically conductive adhesive body 20 dispensing can also be used, such as needle dispensing, and not necessarily jet dispensing only.

Advantageously, the image sensor device 10 has several benefits over the prior art image sensor device 90. In particular, the prior art image sensor device 90 may be prone to open contacts since the electrically conductive paste 96 demands a very consistent volume to fill the recess 98 and properly connect the electrically conductive contacts 93a-93b and the electrically conductive traces 95a-95b. Also, the prior art image sensor device 90 may be subject to electrical shorting since the electrically conductive paste 96 may leak from the recess 98.

As will be appreciated, each of these prior art issues may reduce manufacturing yield and increase manufacturing cost. Positively, the image sensor device 10 does not require the high degree of control for dispensing the electrically conductive adhesive body 20 and reduces the incidence of the open circuits and short circuits, therefore reducing cost and improving yield.

Referring now additionally to FIGS. 7-9, another embodiment of the image sensor device 10' is now described. In this embodiment of the image sensor device 10', those elements already discussed above with respect to FIGS. 4-6 are given prime notation and most require no further discussion herein. This embodiment differs from the previous embodiment in that this each pair of adjacent cell layers 17a'-17d' has a stepped peripheral edge 25a'-25b'. The stepped peripheral edge 25a'-25b' may have an exposed portion of a respective second electrically conductive contact 18a'-18b'. In the illustrated embodiment, the stepped peripheral edge 25a'-25b' includes only two steps corresponding to the two electrically conductive contacts 18a'-18b', but other embodiments could comprise more steps for more complex contact arrangements.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. An image sensor device comprising:
   an interconnect layer;
   an image sensor integrated circuit (IC) on said interconnect layer and having an image sensing surface;
   a barrel adjacent said interconnect layer and comprising a first plurality of electrically conductive traces;
   a liquid crystal focus cell carried by said barrel, the liquid crystal focus cell comprising a variable focus lens comprising a plurality of cell layers, and a second plurality of electrically conductive contacts associated therewith, wherein at least one pair of adjacent cell layers of the variable focus lens has different widths; and
   an electrically conductive adhesive body coupling at least one of said second plurality of electrically conductive contacts to a corresponding one of said first plurality of electrically conductive traces.

2. The image sensor device of claim 1 wherein said plurality of cell layers has a beveled peripheral edge.

3. The image sensor device of claim 2 wherein the beveled peripheral edge is wider at a bottom adjacent said barrel.

4. The image sensor device of claim 1 wherein said at least one pair of adjacent cell layers has a stepped peripheral edge.

5. The image sensor device of claim 4 wherein the stepped peripheral edge has an exposed portion of a respective second electrically conductive contact.

6. The image sensor device of claim 1 wherein said electrically conductive adhesive body is unbounded on a side thereof opposite of said second plurality of electrically conductive contacts.

7. The image sensor device of claim 1 wherein the variable focus lens comprises a solid state autofocus lens cell; and wherein said second plurality of electrically conductive contacts is configured to control an autofocus function of said solid state autofocus lens cell.

8. The image sensor device of claim 1 wherein each cell layer of said liquid crystal focus cell is square-shaped.

9. An image sensor device comprising:
   an interconnect layer;
   an image sensor integrated circuit (IC) on said interconnect layer and having an image sensing surface;
   a barrel adjacent said interconnect layer and comprising
   a housing, and
   a first plurality of electrically conductive traces carried by said housing;
   a liquid crystal autofocus cell carried by said barrel, the liquid crystal autofocus cell comprising a variable focus lens comprising a plurality of cell layers, and a second plurality of electrically conductive contacts associated therewith and configured to control an autofocus function of the variable focus lens, wherein at least one pair of adjacent cell layers of the variable focus lens has different widths; and
   an electrically conductive adhesive body coupling at least one of said second plurality of electrically conductive contacts to a corresponding one of said first plurality of electrically conductive traces wherein said first plurality of electrically conductive traces extends from said interconnect layer to said second plurality of electrically conductive contacts.

10. The image sensor device of claim 9 wherein said plurality of cell layers has a beveled peripheral edge.

11. The image sensor device of claim 10 wherein the beveled peripheral edge is wider at a bottom adjacent said barrel.

12. The image sensor device of claim 9 wherein said at least one pair of adjacent cell layers has a stepped peripheral edge.

13. The image sensor device of claim 12 wherein the stepped peripheral edge has an exposed portion of a respective second electrically conductive contact.

14. The image sensor device of claim 9 wherein said electrically conductive adhesive body is unbounded on a side thereof opposite of said second plurality of electrically conductive contacts.

15. A method for making an image sensor device comprising:
   positioning an image sensor integrated circuit (IC) on an interconnect layer, the image sensor IC having an image sensing surface;
   positioning a barrel adjacent the interconnect layer and comprising a first plurality of electrically conductive traces;
   positioning a liquid crystal focus cell to be carried by the barrel, the liquid crystal focus cell comprising a variable focus lens comprising a plurality of cell layers, and a second plurality of electrically conductive contacts associated therewith, wherein at least one pair of adjacent cell layers of the variable focus lens has different widths; and forming an electrically conductive adhesive body for coupling at least one of the second plurality of electrically conductive contacts to a corresponding one of the first plurality of electrically conductive traces.

16. The method of claim 15 further comprising removing a portion of the plurality of cell layers so that the plurality of cell layers has a beveled peripheral edge.

17. The method of claim 16 wherein the beveled peripheral edge is wider at a bottom adjacent the barrel.

18. The method of claim 15 further comprising removing a portion of the plurality of cell layers so that the at least one pair of adjacent cell layers has a stepped peripheral edge.

19. The method of claim 18 wherein the stepped peripheral edge has an exposed portion of a respective second electrically conductive contact.

20. The method of claim 15 wherein the electrically conductive adhesive body is unbounded on a side thereof opposite of the second plurality of electrically conductive contacts.

21. The method of claim 15 wherein the liquid crystal focus cell comprises a solid state autofocus lens cell; and wherein the second plurality of electrically conductive contacts is configured to control an autofocus function of the solid state autofocus lens cell.

22. An image sensor device comprising:
an interconnect layer;
an image sensor integrated circuit (IC) on said interconnect layer and having an image sensing surface;
a barrel adjacent said interconnect layer and comprising a first plurality of electrically conductive traces;
a liquid crystal focus cell carried by said barrel, the liquid crystal focus cell comprising a variable focus lens comprising a plurality of cell layers, and a second plurality of electrically conductive contacts associated therewith, wherein at least one pair of adjacent cell layers of the variable focus lens has a slanted sidewall inclined to an optical axis perpendicular to the variable focus lens; and
an electrically conductive adhesive body coupling at least one of said second plurality of electrically conductive contacts to a corresponding one of said first plurality of electrically conductive traces.

23. The image sensor device of claim 22, wherein an angle between the slanted sidewall and the optical axis is ten to forty degrees.

* * * * *